United States Patent
Keelan et al.

(10) Patent No.: US 9,350,928 B2
(45) Date of Patent: May 24, 2016

(54) IMAGE DATA COMPRESSION USING STACKED-CHIP IMAGE SENSORS

(71) Applicant: Semiconductor Components Industries, LLC, Phoenix, AZ (US)

(72) Inventors: Brian Keelan, Boulder Creek, CA (US); Dhandapani Dharumalingam, Fremont, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 255 days.

(21) Appl. No.: 13/865,100

(22) Filed: Apr. 17, 2013

(65) Prior Publication Data

US 2013/0293753 A1 Nov. 7, 2013

Related U.S. Application Data

(60) Provisional application No. 61/641,836, filed on May 2, 2012.

(51) Int. Cl.
*H04N 5/369* (2011.01)
*H01L 27/146* (2006.01)
*H04N 5/3745* (2011.01)

(52) U.S. Cl.
CPC .......... *H04N 5/369* (2013.01); *H01L 27/14634* (2013.01); *H01L 27/14636* (2013.01); *H01L 27/14638* (2013.01); *H04N 5/3745* (2013.01)

(58) Field of Classification Search
CPC ................... H04N 5/36–5/378; H04N 19/176; H01L 27/14634; H01L 27/14638; H01L 27/14643; H01L 27/14647; H01L 27/1465; H01L 27/14652; H01L 27/141469
See application file for complete search history.

(56) References Cited

U.S. PATENT DOCUMENTS

| 8,345,969 | B2 | 1/2013 | Newman |
| 2006/0091290 | A1* | 5/2006 | Yoshihara et al. ......... 250/208.1 |
| 2006/0193386 | A1* | 8/2006 | Lin et al. .................. 375/240.16 |
| 2012/0301124 | A1 | 11/2012 | Wang et al. |
| 2013/0070109 | A1* | 3/2013 | Gove ................... H04N 5/3696 348/207.1 |
| 2013/0075607 | A1 | 3/2013 | Bikumandla et al. |

FOREIGN PATENT DOCUMENTS

EP 0370323 7/1997

OTHER PUBLICATIONS

Solhusvik et al., U.S. Appl. No. 13/401,607, filed Feb. 21, 2012.

* cited by examiner

*Primary Examiner* — Paul Berardesca
(74) *Attorney, Agent, or Firm* — Treyz Law Group P.C.; Zachary D. Hadd; Kendall P. Woodruff

(57) ABSTRACT

Imaging systems may be provided with stacked-chip image sensors. A stacked-chip image sensor may include a vertical chip stack that includes an array of image pixels and processing circuitry. The image pixel array may be coupled to the processing circuitry through an array of vertical metal interconnects. The image pixel array may be partitioned into image pixel sub-arrays configured to capture image data at a capture frame rate. The processing circuitry may compress image data associated with each image pixel sub-array in parallel and may output the compressed image data to off-chip image processing circuitry at an output frame rate that is less than the capture frame rate. The processing circuitry may determine respective compression block sizes for each image pixel sub-array with which to compress the associated image data and may determine respective output frame rates for image data from each image pixel sub-array.

18 Claims, 8 Drawing Sheets

IMAGE DATA COMPRESSION USING STACKED-CHIP IMAGE SENSORS

BACKGROUND

This relates generally to imaging systems, and more particularly, to imaging systems with stacked-chip image sensors.

Image sensors are commonly used in imaging systems such as cellular telephones, cameras, and computers to capture images. In a typical arrangement, an image sensor is provided with an array of image sensor pixels and control circuitry for operating the image sensor pixels. In a conventional imaging system the control circuitry is laterally separated from the image sensor pixels on a silicon semiconductor substrate. Each row of image sensor pixels typically communicates with the control circuitry along a common metal line on the silicon semiconductor substrate. Similarly, each column of image sensor pixels communicates with the control circuitry along a common metal line.

In this type of system, the rate at which image pixel data can be read out from the image sensor pixels and the rate at which control signals can be supplied to the image sensor pixels can be limited by the use of the shared column and row lines. This type of limitation can limit the rate at which image frames can be captured and the rate at which image data can be output from the image sensor.

It would therefore be desirable to be able to provide improved imaging systems with enhanced image capture and processing efficiency.

DETAILED DESCRIPTION

Digital camera modules are widely used in imaging systems such as digital cameras, computers, cellular telephones, or other electronic devices. These imaging systems may include image sensors that gather incoming light to capture an image. The image sensors may include arrays of image sensor pixels. The pixels in an image sensor may include photosensitive elements such as photodiodes that convert the incoming light into digital data. Image sensors may have any number of pixels (e.g., hundreds or thousands or more). A typical image sensor may, for example, have hundreds of thousands or millions of pixels (e.g., megapixels).

Each image sensor may be a stacked-chip image sensor having a vertical chip stack that includes an image pixel array die, a control circuitry die, and a digital processing circuitry die. Analog control circuitry on the control circuitry die may be coupled to the image pixel circuitry using vertical conductive paths (sometimes referred to as vertical metal interconnects or vertical conductive interconnects) such as through-silicon vias in a silicon semiconductor substrate. Storage and processing circuitry may be coupled to the analog control circuitry using vertical metal interconnects such as through-silicon vias in the silicon semiconductor substrate. The through-silicon vias may, if desired, be arranged in an array vias. Vertical metal interconnects may be formed at an edge of an image pixel array or throughout an image pixel array. Vertical metal interconnects may be configured to couple rows of image pixels, columns of image pixels, blocks of image pixels, sub-arrays of image pixels, other groups of image pixels, or individual image pixels to the analog control circuitry.

Vertical metal interconnects may be used by the control circuitry to read out image data from image pixels in multiple pixel rows and multiple pixel columns simultaneously thereby increasing the rate at which image data can be obtained from the image pixels in comparison with conventional imaging systems. For example, image data may be captured at a frame rate that is high enough to oversample an oscillating light source such as an LED that oscillates at a frequency of hundreds of cycles per second or to oversample a rapidly moving object such as a baseball or football being thrown by an athlete. Oversampling an oscillating light source may include, for example, capturing image frames at a capture frame rate that is at least twice the number of oscillation cycles per second of the oscillating light source.

Figure 1:
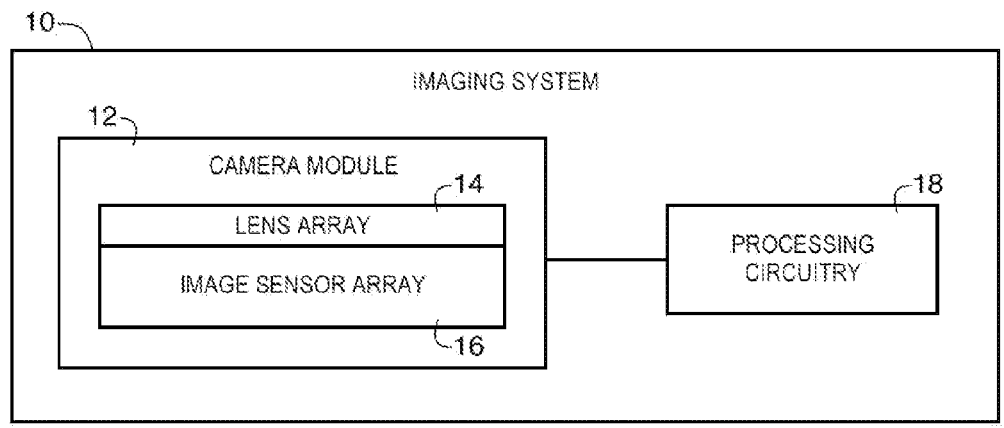
FIG. 1 is a diagram of an illustrative electronic device having stacked-chip image sensors in accordance with an embodiment of the present invention.

FIG. 1 is a diagram of an illustrative imaging system that uses a stacked-chip image sensor to capture images at a high frame rate in comparison with conventional planar imaging systems. Imaging system 10 of FIG. 1 may be a portable imaging system such as a camera, a cellular telephone, a video camera, or other imaging device that captures digital image data. Camera module 12 may be used to convert incoming light into digital image data. Camera module 12 may include an array of lenses 14 and a corresponding array of stacked-chip image sensors 16. Lenses 14 and stacked-chip image sensors 16 may be mounted in a common package and may provide image data to processing circuitry 18.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured and processed by camera module 12 may, if desired, be further processed and stored using processing circuitry 18. Processed image data may, if desired, be provided to external equipment (e.g., a computer or other device) using wired and/or wireless communications paths coupled to processing circuitry 18.

Image sensor array 16 may contain an array of individual stacked-chip image sensors configured to receive light of a given color by providing each stacked-chip image sensor with a color filter. The color filters that are used for image sensor pixel arrays in the image sensors may, for example, be red filters, blue filters, and green filters. Each filter may form a color filter layer that covers the image sensor pixel array of a respective image sensor in the array. Other filters such as white (clear) color filters, ultraviolet filters, dual-band IR cutoff filters (e.g., filters that allow visible light and a range of infrared light emitted by LED lights), etc. may also be used.

An array of stacked-chip image sensors may be formed on one or more semiconductor substrates. With one suitable arrangement, which is sometimes described herein as an example, each vertical layer of a stacked-chip image sensor array (e.g., the image pixel array layer, the control circuitry layer, or the processing circuitry layer) is formed on a common semiconductor substrate (e.g., a common silicon image sensor integrated circuit die). Each stacked-chip image sensor may be identical. For example, each stacked-chip image sensor may be a Video Graphics Array (VGA) sensor with a resolution of 480×640 sensor pixels (as an example). Other types of image sensor may also be used for the image sensors if desired. For example, images sensors with greater than VGA resolution or less than VGA resolution may be used, image sensor arrays in which the image sensors are not all identical may be used, etc. If desired, image sensor array 16 may include a single stacked-chip image sensor.

Figure 2:
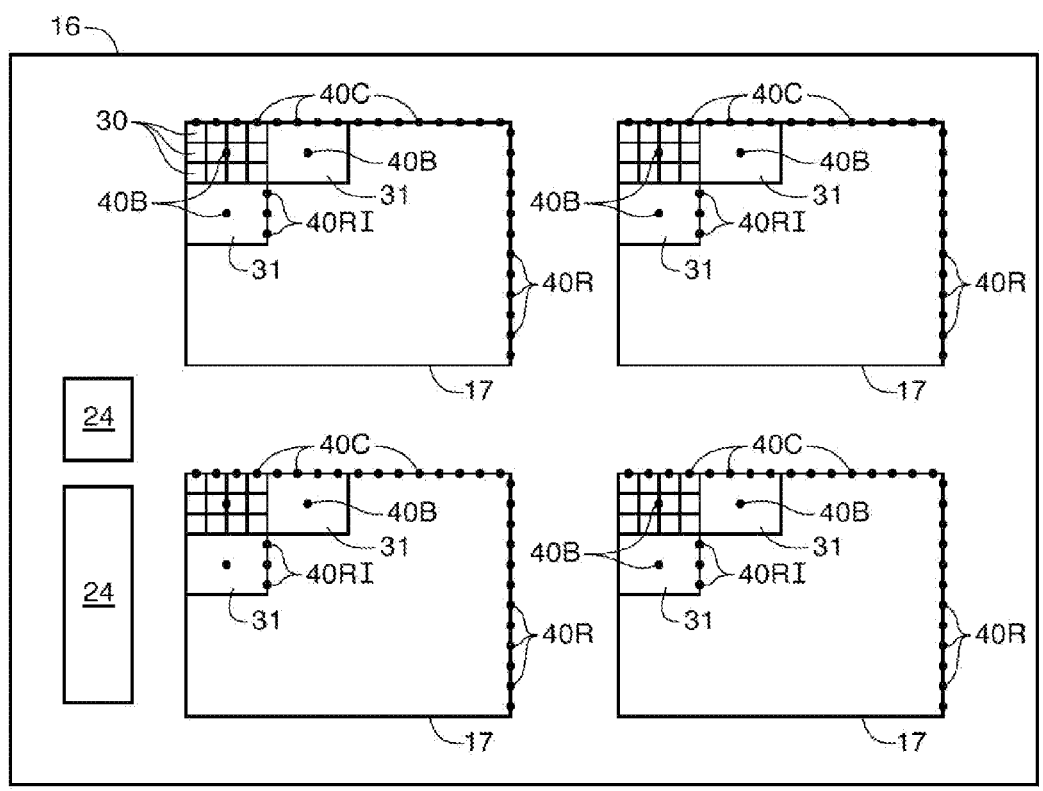
FIG. 2 is a top view of an illustrative image sensor array having a plurality of stacked-chip image sensors each having vertical conductive interconnects for coupling image pixel sub-arrays to control circuitry in accordance with an embodiment of the present invention.
Figure 2:
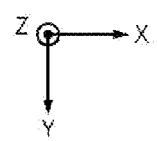

As shown in FIG. 2, image sensor array 16 may include multiple image pixel arrays such as image pixel arrays 17 that are formed on a single integrated circuit die. In the example of FIG. 2, image sensor array 16 includes four stacked-chip image sensors. However, this is merely illustrative. If desired, image sensor array 16 may include a single stacked-chip image sensor, two stacked-chip image sensors, three stacked-chip image sensors, or more than four stacked-chip image sensors.

Each pixel array 17 may have image sensor pixels such as image pixels 30 that are arranged in rows and columns. Each image sensor pixel array 17 may have any suitable resolution (e.g., 640×480, 4096×3072, etc.). Image sensor pixels 30 may be formed on a planar surface (e.g., parallel to the x-y plane of FIG. 2) of a semiconductor substrate such as a silicon die.

As shown in FIG. 2, each image pixel array 17 may be provided with an array of vertical conductive paths such as conductive interconnects 40 (e.g., metal lines, through-silicon vias, etc. that run perpendicular to the x-y plane of FIG. 2) such as row interconnects 40R, column interconnects 40C, pixel sub-array interconnects 40B, and internal row interconnects 40RI. Row interconnects 40R, column interconnects 40C, pixel sub-array interconnects 40B, and internal row interconnects 40R1 may each be configured to couple one or more image pixels 30 to control circuitry (e.g., analog control circuitry) that is vertically stacked with the associated image pixel array (e.g., stacked in the z-direction of FIG. 2).

For example, a row interconnect 40R may couple an associated row of image sensor pixels 30 to control circuitry such as row driver circuitry that is vertically stacked with an image pixel array 17. Row interconnects 40R may be coupled to pixel rows along an edge of image pixel array 17. Each pixel row may be coupled to one of row interconnects 40R. A column interconnect 40C may couple an associated column of image sensor pixels 30 to control circuitry that is vertically stacked with an image pixel array 17. Each image pixel array 17 may be partitioned into a number of image pixel sub-arrays 31. Pixel sub-arrays 31 may include a set of image pixels 30 in image pixel array 17. In the example of FIG. 2, each pixel sub-array 31 includes a group of image pixels 30 arranged in a rectangular pattern. Each pixel sub-array 31 may be, for example, a 4×4 pixel sub-array, an 8×8 pixel sub-array, a 16×16 pixel sub-array, a 32×32 pixel sub-array, etc.

In general, pixel sub-arrays 31 may include image pixels 30 arranged in any desired pattern. If desired, pixel sub-arrays 31 may have a shape that is neither square nor rectangular (e.g., a pixel block may contain 3 pixels of one pixel row, 5 pixels of another pixel row and 10 pixels of a third pixel row, or any arbitrary grouping of adjacent pixels).

All pixel sub-arrays 31 may include the same number of pixels 30 or some pixel sub-arrays 31 may include different numbers of pixels than other sub-arrays 31. All pixel sub-arrays 31 may have the same shape (e.g., all sub-arrays 31 may be square or all sub-arrays 31 may be rectangular), or some sub-arrays 31 may have different shapes than other sub-arrays. Each pixel sub-array 31 in a given image pixel array 17 may be coupled via an associated sub-array interconnect 40B to control circuitry such as analog-to-digital conversion circuitry that is vertically stacked with image pixel array 17. An internal row interconnect 40RI may couple a portion of a row of image sensor pixels 30 (e.g., a row of image pixels 30 within a particular pixel sub-array 31) to control circuitry that is vertically stacked with an image pixel array 17. Each pixel row in image pixel array 17 may be coupled to multiple internal row interconnects 40RI. Internal row interconnects 40RI may be coupled to image pixels 30 along an edge of one or more pixel sub-arrays 31 and may couple the pixels 30 of that pixel sub-array 31 to the control circuitry.

Row interconnects 40R, column interconnects 40C, pixel sub-array interconnects 40B, and internal row interconnects 40RI may each be formed from, for example, through-silicon vias that pass from a first silicon semiconductor substrate (e.g., a substrate having an image pixel array) to a second silicon semiconductor substrate (e.g., a substrate having control and readout circuitry for the image pixel array). If desired, image sensor array 16 may include support circuitry 24 that is horizontally (laterally) separated from image pixel arrays 17 on the semiconductor substrate.

Figure 3:
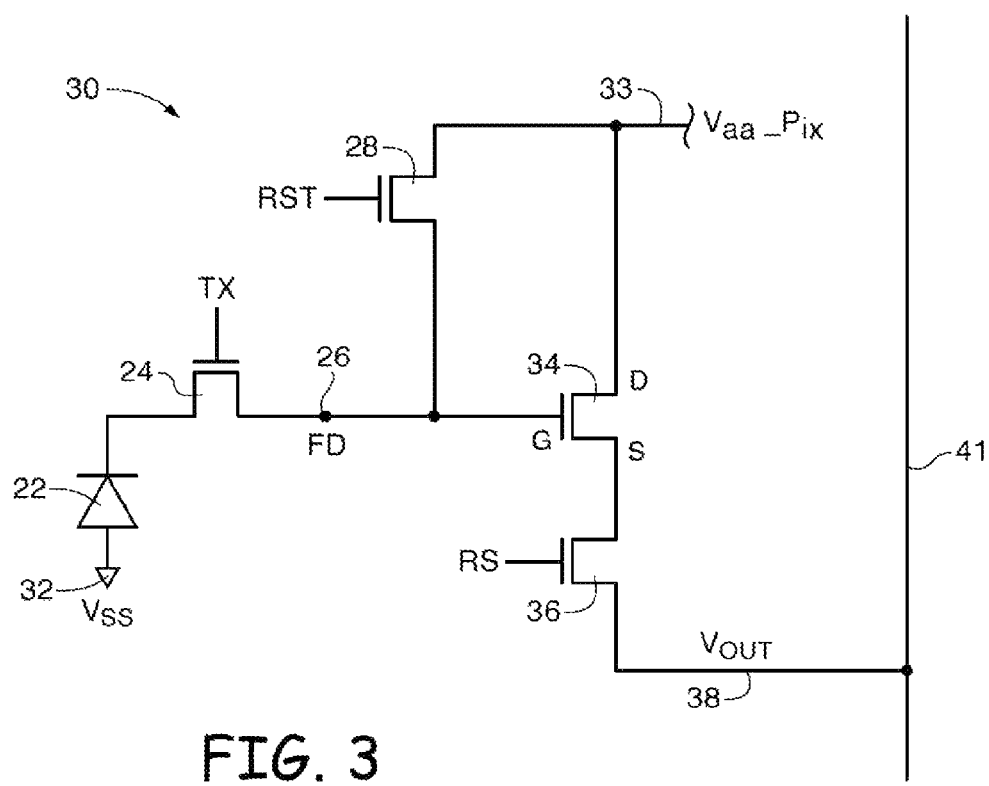
FIG. 3 is a diagram of an illustrative image sensor pixel in accordance with an embodiment of the present invention.

Circuitry in an illustrative image pixel 30 of a given stacked-chip image pixel array 17 is shown in FIG. 3. As shown in FIG. 3, pixel 30 may include a photosensitive element such as photodiode 22. A positive pixel power supply voltage (e.g., voltage Vaa pix) may be supplied at positive power supply terminal 33. A ground power supply voltage (e.g., Vss) may be supplied at ground terminal 32. Incoming light is gathered by photodiode 22 after passing through a color filter structure. Photodiode 22 converts the light to electrical charge.

Before an image is acquired, reset control signal RST may be asserted. This turns on reset transistor 28 and resets charge storage node 26 (also referred to as floating diffusion FD) to Vaa. The reset control signal RST may then be deasserted to turn off reset transistor 28. After the reset process is complete, transfer gate control signal TX may be asserted to turn on transfer transistor (transfer gate) 24. When transfer transistor 24 is turned on, the charge that has been generated by photodiode 22 in response to incoming light is transferred to charge storage node 26.

Charge storage node 26 may be implemented using a region of doped semiconductor (e.g., a doped silicon region formed in a silicon substrate by ion implantation, impurity diffusion, or other doping techniques). The doped semiconductor region (i.e., the floating diffusion FD) may exhibit a capacitance that can be used to store the charge that has been transferred from photodiode 22. The signal associated with the stored charge on node 26 is conveyed to row select transistor 36 by source-follower transistor 34.

If desired, other types of image pixel circuitry may be used to implement the image pixels of sensors 16. For example, each image sensor pixel 30 (see, e.g., FIG. 1) may be a three-transistor pixel, a pin-photodiode pixel with four transistors, a global shutter pixel, etc. The circuitry of FIG. 3 is merely illustrative.

When it is desired to read out the value of the stored charge (i.e., the value of the stored charge that is represented by the signal at the source S of transistor 34), select control signal RS can be asserted. When signal RS is asserted, transistor 36 turns on and a corresponding signal Vout that is representative of the magnitude of the charge on charge storage node 26 is produced on output path 38. In a typical configuration, there are numerous rows and columns of pixels such as pixel 30 in the image sensor pixel array of a given image sensor. A conductive path such as path 41 can be associated with one or more pixels such as a particular sub-array 31 of image pixels 30.

When signal RS is asserted in a given sub-array of pixels, path 41 can be used to route signal Vout from pixels in that sub-array to readout circuitry. Path 41 may, for example, be coupled to one of sub-array interconnects 40B. Image data such as charges collected by photosensor 22 may be passed along one of sub-array interconnects 40B to associated control and readout circuitry that is vertically stacked with image pixel array 17. In this way, multiple pixel sub-arrays 31 in a given pixel array 17 may be read-out in parallel. If desired, image data from two or more sub-arrays 31 in a given pixel array 17 may be subsequently processed in parallel by storage and processing circuitry in stacked-chip image sensor 16.

Figure 4:
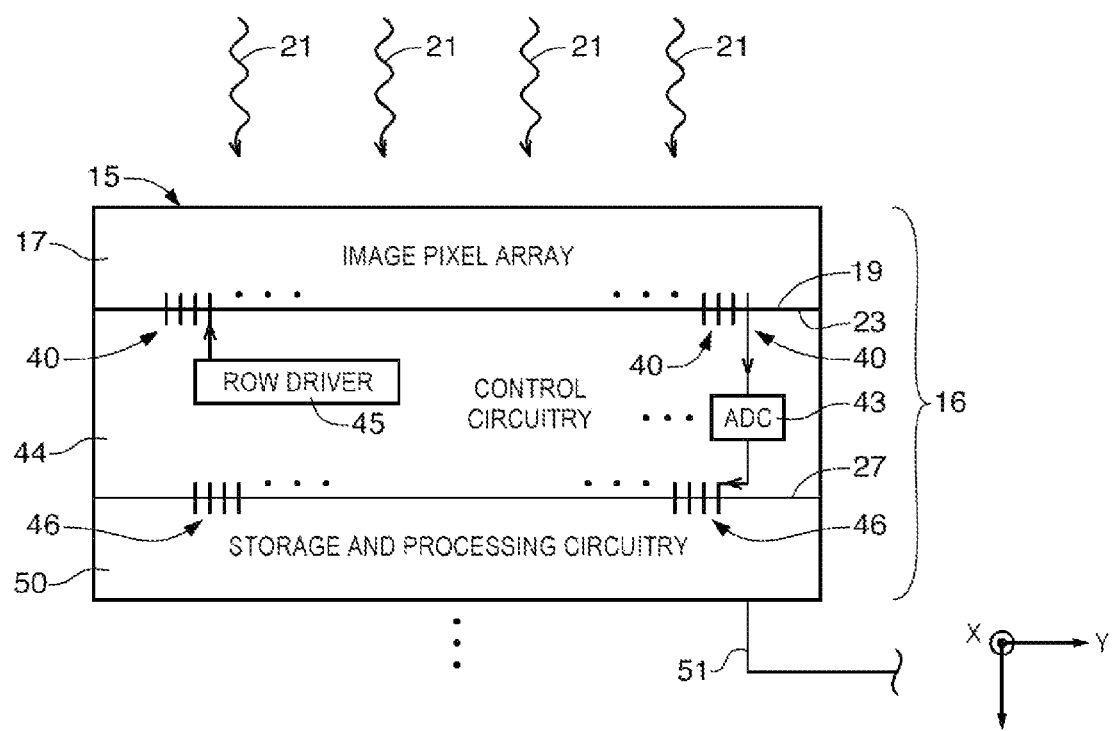
FIG. 4 is a diagram of an illustrative stacked-chip image sensor having an image pixel array in a vertical chip stack that includes analog control circuitry and storage and processing circuitry coupled by vertical metal interconnects in accordance with an embodiment of the present invention.

As shown in FIG. 4, an image pixel array such as image pixel array 17 may be formed in a vertical chip stack with analog control and readout circuitry such as control circuitry 44 and storage and processing circuitry such as storage and processing circuitry 50. If desired, image pixel array 17 may be a front-side illuminated (FSI) image pixel array in which image light 21 is received by photosensitive elements through a layer of metal interconnects or may be a backside illuminated (BSI) image pixel array in which image light 21 is received by photosensitive elements formed on a side that is opposite to the side on which the layer of metal interconnects is formed.

Image pixel array 17 may be formed on a semiconductor substrate that is configured to receive image light 21 through a first surface (e.g., surface 15) of the semiconductor substrate. Control circuitry 44 may be formed on an opposing second surface (e.g., surface 19) of the semiconductor substrate. Control circuitry 44 may be formed on an additional semiconductor substrate (semiconductor integrated circuit die) having a surface such as surface 23 that is attached to surface 19 of image pixels array 17. Control circuitry 44 may be coupled to image pixels in image pixel array 17 using vertical conductive paths (vertical conductive interconnects) 40 (e.g., row interconnects 40R, column interconnects 40C, pixel sub-array interconnects 40B, and/or internal row interconnects 40RI of FIG. 2). Vertical conductive interconnects 40 may be formed from metal conductive paths or other conductive contacts that extend through surface 19 and surface 23. As examples, vertical conductive interconnects 40 may include through-silicon vias that extend through surface 19 and/or surface 23, may include microbumps that protrude from surface 19 into control circuitry substrate 44 through surface 23, may include microbumps that protrude from surface 23 into image pixel array substrate 17 through surface 23, or may include any other suitable conductive paths that vertically couple pixel circuitry in image pixel array 17 to control circuitry 44.

Image pixel array 17 may include one or more layers of dielectric material having metal traces for routing pixel control and readout signals to image pixels 30. Vertical conductive interconnects 40 (e.g., row interconnects 40R, column interconnects 40C, pixel sub-array interconnects 40B, and/or internal row interconnects 40RI of FIG. 2) may be coupled to metal traces in image pixel array 17.

Image data such as signal Vout (FIG. 3) may be passed from pixel output paths 40 (FIG. 3) along interconnects 40 from image pixel array 17 to control circuitry 44. Control signals such as reset control signal RST, row/pixel select signal RS, transfer signal TX or other control signals for operating pixels 30 may be generated using control circuitry 44 and passed vertically to pixels 30 in image pixel array 17 along vertical interconnects 40.

Control circuitry 44 may be configured to operate pixels 30 of image pixel array 17. Control circuitry 44 may include row control circuitry (row driver circuitry) 45, bias circuitry (e.g., source follower load circuits), sample and hold circuitry, correlated double sampling (CDS) circuitry, amplifier circuitry, analog-to-digital (ADC) conversion circuitry 43, data output circuitry, memory (e.g., buffer circuitry), address circuitry, etc. Control circuitry 44 may be configured to provide bias voltages, power supply voltages or other voltages to image pixel array 17. Control circuitry 44 may be formed as a stacked layer of image pixel array 17 that is coupled to pixel circuitry of pixel array 17 or may be formed on an additional semiconductor integrated circuit die that is coupled to image pixel array 17 using interconnects 40. Some interconnects 40 may be configured to route image signal data from image pixel array 17 to ADC circuit 43. Digital image data from ADC converter 43 may then be provided to storage and processing circuitry 50. Storage and processing circuitry 50 may, for example, be an image coprocessor (ICOP) chip that is stacked with control circuitry 44.

Image data signals read out using control circuitry 44 from photosensitive elements on image pixel array 17 may be passed from control circuitry 44 to storage and processing circuitry 50 that is vertically stacked (e.g., in direction z) with image pixel array 17 and control circuitry 44 along vertical interconnects such as interconnects 46. Vertical interconnects 46 may include through-silicon vias, microbumps or other suitable interconnects that couple metal lines in control circuitry 44 to metal lines in processing circuitry and storage 50.

Circuitry 50 may be partially integrated into control circuitry 44 or may be implemented as a separated semiconductor integrated circuit that is attached to a surface such as surface 27 of control circuitry 44. Image sensor 16 may include additional vertical conductive interconnects 46 such as metal conductive paths or other conductive contacts that extend through surface 27. As examples, vertical conductive interconnects 46 may include through-silicon vias that extend through surface 27, may include microbumps that protrude from surface 27 into processing circuitry substrate 50, or may include any other suitable conductive paths that vertically couple control circuitry 44 to storage and processing circuitry 50.

Processing circuitry 50 may include one or more integrated circuits (e.g., image processing circuits, microprocessors, storage devices such as random-access memory and non-volatile memory, etc.) and may be implemented using components that are separate from control circuitry 44 and/or that form part of control circuitry 44.

Image data that has been captured by image pixel array 17 may be processed and stored using processing circuitry 50. Storage and processing circuitry may, for example, process image data from multiple pixel sub-arrays 31 in parallel. Image data may be captured at a capture frame rate using image pixel array 17 and processed using storage and processing circuitry 50. Processed image data may be stored in storage and processing circuitry 50 or may be passed to external circuitry such as circuitry 18 along, for example, path 51. Processed image data may be passed to off-chip processing circuitry 18 at an output frame rate that is lower than the capture frame rate. Multiple image frames captured at the capture frame rate may be combined to form the processed image data that is output from stacked-chip image sensor 16.

Storage and processing circuitry 50 formed in a vertical stack with image pixel array 17 of stacked-chip image sensor 16 may, for example, select a subset of digital image data to use in constructing a final image (e.g., image data from one or more pixel sub-arrays 31), may combine multiple frames that contain transient signals (e.g., image signals from a flashing light or a moving object) to form corrected image frames, may extract image depth information, or may provide processing options to a user of system 10.

FIG. 4 is merely illustrative. If desired, part or all of control circuitry 44 may be formed as a part of image pixel array 17 (e.g., control circuitry such as row driver 45 and ADC 43 may be formed on the same semiconductor substrate as image pixel array 17 in stacked-chip image sensor 16) and/or as a part of storage and processing circuitry 50 (e.g., control circuitry such as row driver 45 and ADC 43 may be formed on the same semiconductor die as storage and processing circuitry 50).

Storage and processing circuitry 50 (sometimes referred to as stacked processing circuitry or stacked-chip processing circuitry) may be used to blend image data from red, blue, and green sensors to produce full-color images, may be used to determine image parallax corrections, may be used to produce 3-dimensional (sometimes called stereo) images using data from two or more different sensors that have different vantage points when capturing a scene, may be used to produce increased depth-of-field images using data from two or more image sensors, may be used to adjust the content of an image frame based on the content of a previous image frame, or may be used to otherwise process image data.

Stacked processing circuitry 50 may be configured to perform white balancing, color correction, high-dynamic-range image combination, motion detection, object distance detection, or other suitable image processing on image data that has been passed vertically from control circuitry 44 to processing circuitry 50. Processed image data may, if desired, be provided to external equipment (e.g., a computer, other device, or additional processing circuitry such as processing circuitry 18) using wired and/or wireless communications paths coupled to processing circuitry 50.

When capturing images using a stacked image sensor at a high frame rate, a relatively large amount of data may be read out of image pixel array 17 in a given period of time in comparison with conventional planar imaging systems. In order to process the high volume of image data captured by image pixel array 17 efficiently, it may be desirable to perform compression operations on the captured image data using processing circuitry formed on stacked-chip image sensor 16.

In order to improve data readout bandwidth for stacked-chip image sensors such as sensors 16, storage and processing circuitry 50 may perform data compression operations on image data received from image pixel array 17. For example, stacked processing circuitry 50 may perform data compression operations on image data from one or more pixel sub-arrays 31 in a given image sensor pixel array 17 (e.g., processing circuitry 50 may perform compression operations on image data from multiple sub-arrays 31 in parallel). By performing separate compression operations on image data in each pixel sub-array 31, stacked processing circuitry 50 may flexibly control the amount of compression that is performed for image data captured by image pixel array 17 to improve the efficiency of image data readout from stacked image sensor 16.

Figure 5:
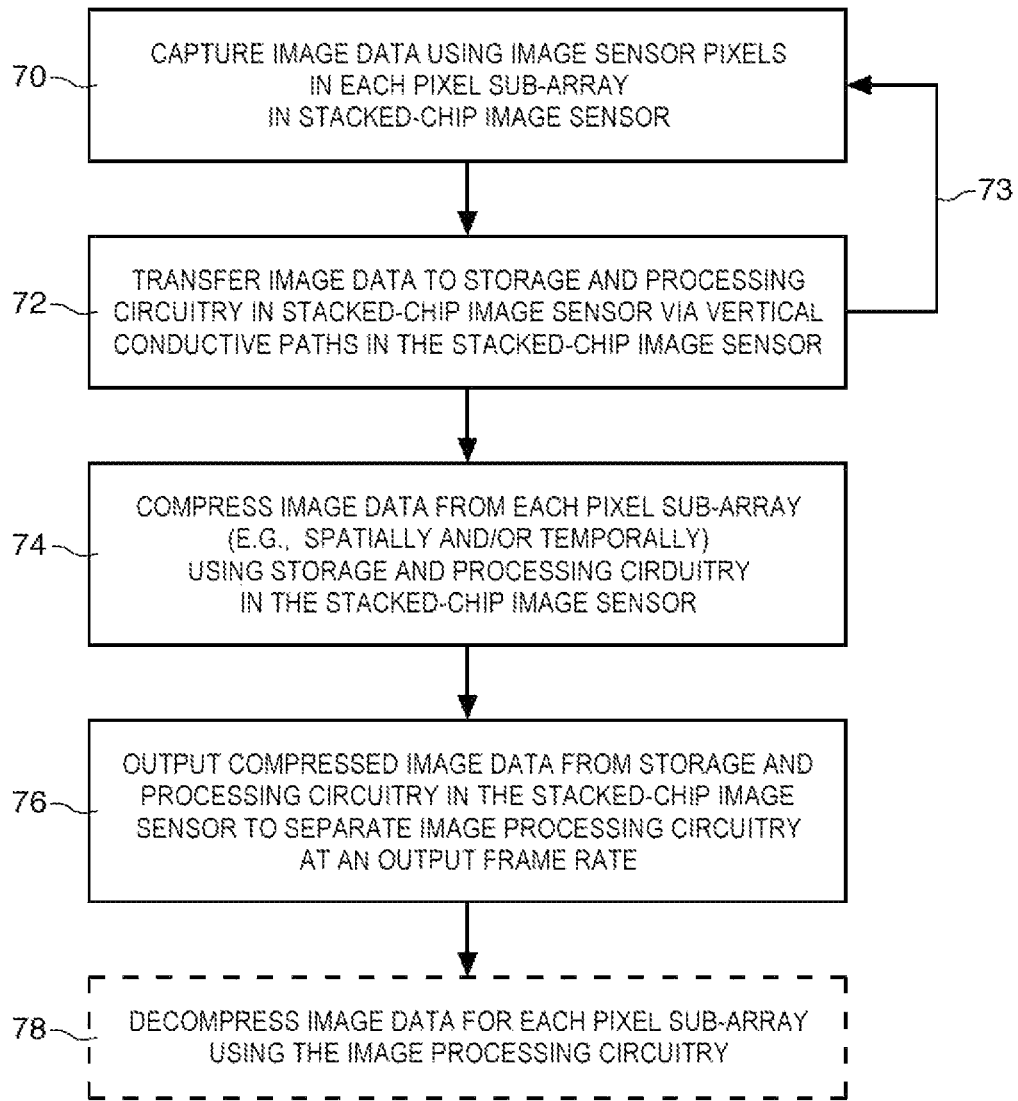
FIG. 5 is a flow chart of illustrative steps involved in compressing image data captured using an image pixel array with pixel sub-arrays in a stacked-chip image sensor and outputting the compressed image data to image processing circuitry in accordance with an embodiment of the present invention.

FIG. 5 is a flow chart of illustrative steps that may be used for capturing and compressing high-frame-rate image data using a stacked-chip image sensor such as stacked-chip image sensor 16 of FIG. 4.

At step 70, image pixels 30 in each pixel sub-array 31 of a given image pixel array 17 may be used in capturing image data corresponding to a scene. For example, a respective pixel signal may be generated by each image pixel 30 in each sub-array 31 in response to image light from the scene.

At step 72 the image signals may be transferred to storage and processing circuitry 50 through control circuitry 44 through vertical conductive interconnects 40. If desired, control circuitry 44 may convert the image signals into digital image data before providing the digital image data to circuitry 50. If desired, circuitry 44 may perform other analog signal processing operations (e.g., amplification) on the image signals prior to analog-to-digital conversion of the image signals. Image data may be transferred to stacked processing circuitry 50 from control circuitry 44 via vertical conductive interconnects 46. Image data from each sub-array 31 may be transferred to stacked processing circuitry 50 via the associated sub-array interconnect 40B. If desired, image data from multiple pixel sub-arrays 31 may be transferred to storage and processing circuitry 50 in parallel (e.g., via multiple sub-array interconnects 40B).

Processing may loop back to step 70 via 73 to capture and transfer additional frames of image data using pixel sub-arrays 31. For example, each pixel sub-array 31 may perform non-destructive sampling of integrated charge (e.g., over a number of captured image frames). In another suitable arrangement, each pixel sub-array 31 may perform a full read out and reset of photodiodes 22 between captured image frames (FIG. 3).

At step 74, stacked storage and processing circuitry 50 may compress image data received from image pixel array 17. For example, stacked processing circuitry 50 may compress image data from each pixel sub-array 31 in image pixel array 17. If desired, stacked processing circuitry 50 may separately compress image data from multiple pixel sub-arrays 31 sequentially or in parallel.

Stacked processing circuitry 50 may perform spatial compression on image data received from each pixel sub-array 31 (e.g., compression that compensates for redundancy in image data between image pixels 30 across the corresponding sub-array 31). For example, processing circuitry 50 may identify a so-called "compression block" of image pixels 30 for compressing. The compression block may be any desired size that is less than or equal to the size of the associated sub-array 31 (e.g., a compression block having 32×32 pixels, 8×8 pixels, etc.). If desired, stacked processing circuitry 50 may analyze the image data within a given pixel sub-array 31 to determine the size of the associated compression block. Processing circuitry 50 may compress image data from image sensor pixels 30 located within the compression block for each sub-array 31.

If desired, stacked processing circuitry 50 may perform temporal compression on image data received from each pixel sub-array 31 (e.g., compression that compensates for redundancy between image data captured in sequential image frames). Processing circuitry 50 may, for example, perform temporal compression operations on the received image data by comparing image data from the current image frame to image data from previous image frames. Processing circuitry 50 may, if desired, perform both spatial and temporal compression on image data received from a given pixel sub-array 31.

As an example, processing circuitry 50 may perform frequency domain transforms on image data within the compression block associated with each pixel sub-array 31. By performing a frequency domain transform on the image data, processing circuitry 50 may generate a number of transform coefficients representative of the compressed image data. The number of transform coefficients produced by processing circuitry 50 may be dependent on the amount (level) of compression that is performed (e.g., a relatively high number of transform coefficients may correspond to a higher level of compression than a relatively low number of transform coefficients).

By separately performing compression on each pixel sub-array 31 in pixel array 17, processing circuitry 50 may vary the amount of compression performed across each pixel sub-array in array 17 (e.g., processing circuitry 50 may perform more compression for image data from some pixel sub-arrays than other pixel sub-arrays). For example, processing circuitry 50 may perform more compression for sub-arrays 31 having image data with a relatively large spatial and/or temporal redundancy than for sub-arrays 31 having image data with a relatively small spatial and/or temporal redundancy. By performing compression on the captured image data, stacked processing circuitry 50 may flexibly reduce the amount of data that is read-out from stacked-chip image sensor 16.

At step 76, stacked storage and processing circuitry 50 may output the compressed image data from each sub-array 31 to separate processing circuitry (e.g., processing circuitry that is not formed as a part of stacked image sensor 16 such as processing circuitry 18 of FIG. 1). If desired, the transform coefficients generated by stacked processing circuitry 50 during compression may be read-out to processing circuitry 18. The compressed image data may be output from stacked storage and processing circuitry 50 at an output frame rate. The output frame rate may be less than the capture frame rate with which image pixel array 17 captured the image data (e.g., the output frame rate may be less than or equal to 60 frames per second whereas the capture frame rate may be greater than or equal to 90 frames per second, etc.).

At optional step 78, image processing circuitry such as processing circuitry 18 may decompress the image data received from stacked image sensor 16. Processing circuitry 18 may decompress the image data for each sub-array 31 to generate a final image. For example, processing circuitry 18 may perform an inverse transform on the image data (e.g., using the received transform coefficients) to reconstruct the image data captured by image pixel array 17.

Figure 6:
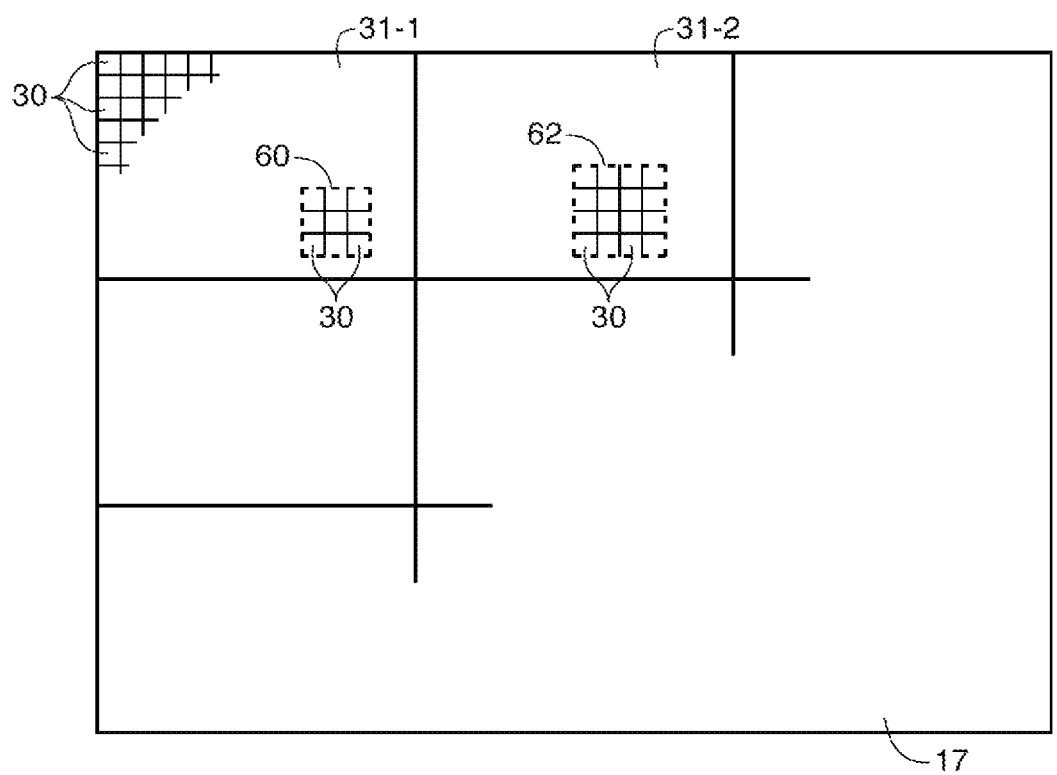
FIG. 6 is a diagram of an illustrative stacked-chip image pixel array having a number of pixel sub-arrays showing how compression blocks of different sizes may be used for compressing captured image data in accordance with an embodiment of the present invention.

FIG. 6 is an illustrative diagram that shows how stacked processing circuitry 50 may identify compression blocks having different compression block sizes for compressing image data received from pixel sub-arrays 31 (e.g., from a first sub-array 31-1, a second sub-array 31-2, etc.). As shown in FIG. 6, stacked processing circuitry 50 may select a first compression block 60 of image pixels 30 for compressing image data received from first sub-array 31-1 and may select a second compression block 62 of image pixels 30 for compressing image data received from second sub-array 31-2.

Stacked processing circuitry 50 may analyze the image data in each sub-array 31 to determine the size of the corresponding compression blocks. For example, processing circuitry 50 may determine a spatial frequency distribution of the image data within each sub-array 31 to determine the size of the associated compression block. If desired, the size of each compression block may be smaller for sub-arrays having higher spatial frequency image data than for sub-arrays having lower spatial frequency image data.

In the example of FIG. 6, first compression block 60 is smaller than second compression block 62 (e.g., first compression block 60 includes image data from nine image pixels 30 whereas second compression block 62 includes image data from sixteen image pixels 30). During image data compression for first sub-array 31-1, stacked processing circuitry 50 may perform compression using a compression block having fewer image pixels than while compressing image data from second sub-array 31-2. First sub-array 31-1 may, for example, have image data with a higher spatial frequency than second sub-array 31-2.

The example of FIG. 6 is merely illustrative. If desired, compression blocks 60 and 62 may have any desired size and shape. For example, compression block 60 may include all pixels 30 within sub-array 31-1, may include pixels 30 arranged in a circular shape within sub-array 31-2, arranged in an oval shape, etc. In general, compression block 60 may include any subset of image pixels 30 within sub-array 31-1. Processing circuitry 50 may determine respective compression blocks having associated compression block sizes for each pixel sub-array 31 within image pixel array 17.

Figure 7:
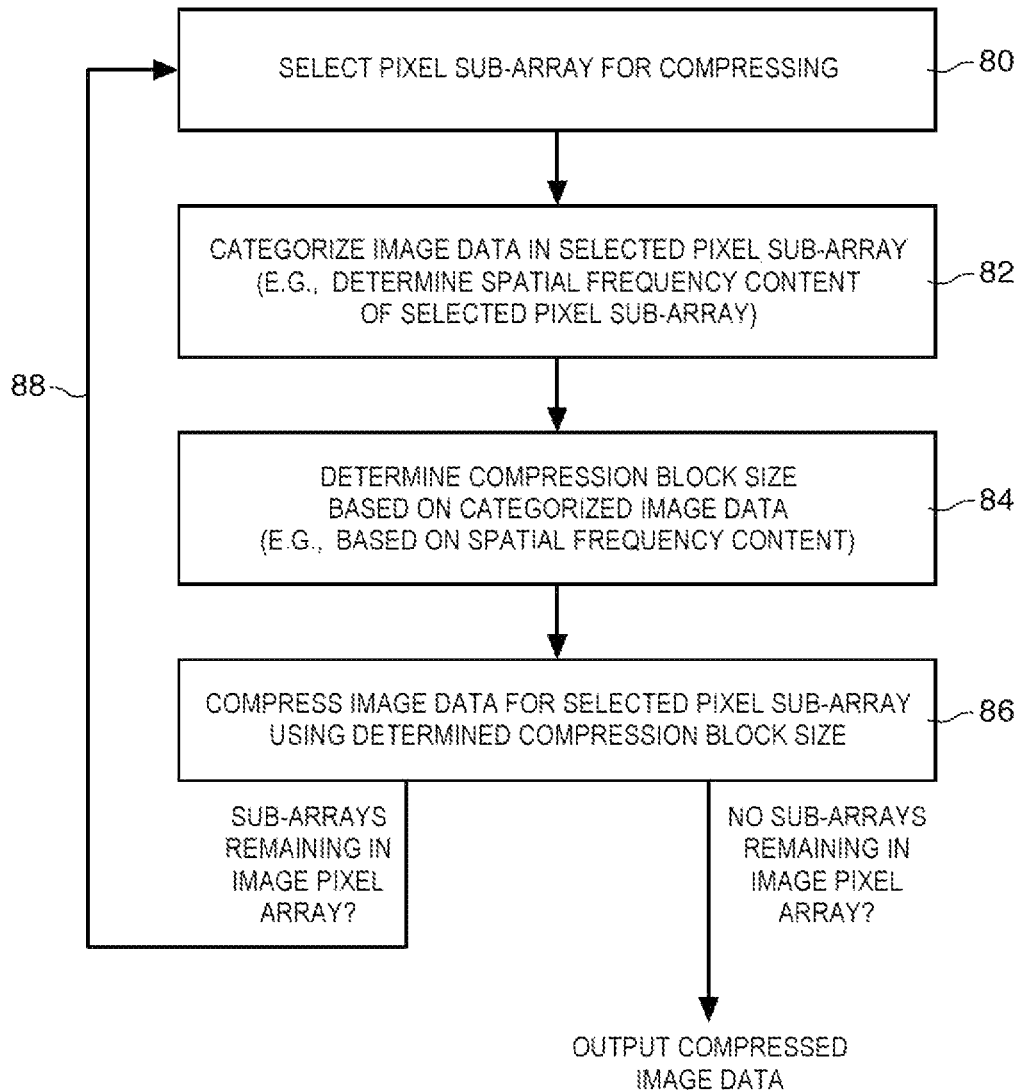
FIG. 7 is a flow chart of illustrative steps involved in compressing image data captured using pixel sub-arrays in a stacked-chip image sensor in accordance with an embodiment of the present invention.

FIG. 7 is a flow chart of illustrative steps that may be used for determining compression block size for each sub-array 31 in image pixel array 17. The steps of FIG. 7 may, for example, be performed by stacked processing circuitry 50 while processing step 74 of FIG. 5 (e.g., to compress image data from each sub-array 31).

At step 80, stacked processing circuitry 50 may select a pixel sub-array 31 for compressing. For example, processing circuitry 50 may select first pixel sub-array 31-1 of FIG. 6 for compressing.

At step 82, stacked processing circuitry 50 may categorize the image data in the selected pixel sub-array 31. For example, processing circuitry 50 may determine the spatial frequency distribution of the image data from pixel sub-array 31. As examples, processing circuitry 50 may determine that the selected sub-array 31 has a relatively high spatial frequency or a relatively low spatial frequency.

At step 84, stacked processing circuitry 50 may identify a compression block size for the selected sub-array 31 based on the categorized image data for sub-array 31. For example, processing circuitry 50 may determine a compression block size based on the spatial frequency distribution of image data from the selected sub-array 31. If desired, processing circuitry 50 may identify a larger compression block size if sub-array 31 has a relatively low spatial frequency than if sub-array 31 has a relatively high spatial frequency. As examples, processing circuitry 50 may identify a 16×16 pixel compression block size if the selected sub-array 31 has a relatively low spatial frequency and may identify an 8×8 pixel compression block size if the selected sub-array 31 has a relatively high spatial frequency.

At step 86, stacked processing circuitry 50 may perform compression on image data from the selected sub-array 31 using the determined compression block size. For example, processing circuitry 50 may perform spatial and/or temporal compression on image data from sub-array 31 using compression block 60 of FIG. 6. If desired, processing circuitry 50 may perform a frequency domain transform on the compression block associated with the selected sub-array 31. Processing circuitry 50 may generate a number of transform coefficients associated with the frequency domain transform of the compression block. The number of transform coefficients that are generated may be dependent on the level of compression that is performed.

If sub-arrays 31 remain in image pixel array 17 to compress, processing may loop back to step 80 via path 88 to compress the image data for additional sub-arrays 31. If no sub-arrays 31 remain in image pixel array 17 to compress, compression operations may be completed (e.g., processing may proceed to step 76 of FIG. 5 to output the compressed image data for each sub-array 31). In another suitable arrangement, the steps of FIG. 7 may be performed for two or more pixel sub-arrays 31 in parallel.

If desired, storage and processing circuitry 50 may adjust the output frame rate with which compressed image data is read out from stacked storage and processing circuitry 50. Storage and processing circuitry 50 may separately adjust the output frame rate for image data from each sub-array 31 in pixel array 17. For example, circuitry 50 may process multiple frames of image data that is captured by each sub-array 31 to determine temporal redundancies in the image data across image frames. Circuitry 50 may reduce the amount of data that is output from stacked image sensor 16 by reducing output frame rate for image data with a relatively high amount of temporal redundancy, thereby conserving bandwidth and increasing image data readout efficiency.

Figure 8:
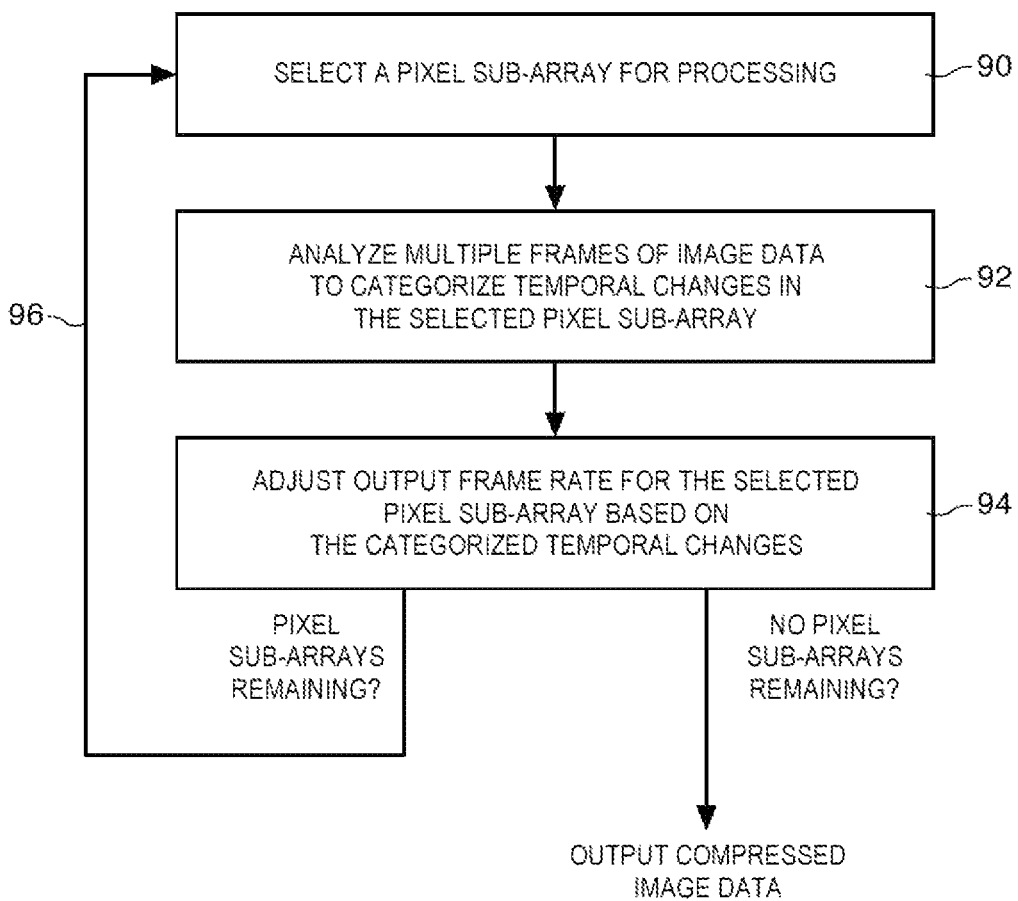
FIG. 8 is a flow chart of illustrative steps involved in adjusting the output frame rate of image data that is read out from pixel sub-arrays in stacked-chip image sensors in accordance with an embodiment of the present invention.

FIG. 8 is a flow chart of illustrative steps that may be performed by storage and processing circuitry 50 to adjust the output frame rate for each pixel sub-array 31 in image pixel array 17. The steps of FIG. 8 may, for example, be performed by stacked processing circuitry 50 after processing step 72 of FIG. 5. In another suitable arrangement, the steps of FIG. 8 may be performed after processing step 74 of FIG. 5.

At step 90, stacked processing circuitry 50 may select a pixel sub-array 31 for processing. For example, processing circuitry 50 may select first pixel sub-array 31-1 of FIG. 6 for processing.

At step 92, stacked processing circuitry 50 may analyze multiple frames of image data captured using the selected sub-array to categorize temporal changes in the image data from the selected pixel sub-array. For example, processing circuitry 50 may determine whether the image data from sub-arrays 31 exhibit a relatively large temporal change between captured image frames (e.g., changes resulting from changing lighting conditions, moving objects, camera motion, etc.) or a relatively small temporal change between captured image frames (e.g., image data from relatively static scenes).

At step 94, stacked processing circuitry 50 may adjust the output frame rate for the selected sub-array 31 based on the categorized temporal changes in the selected sub-array. For example, processing circuitry 50 may decrease the output frame rate if the selected sub-array 31 has a relatively low temporal change between captured image frames. In this way, the data that is output to processing circuitry 18 for the selected sub-array 31 may be lower when the captured scene content changes gradually than when the captured scene content changes rapidly.

If sub-arrays 31 in image pixel array 17 remain to be processed, processing may loop back to step 90 via path 96 to adjust the output frame rate for additional sub-arrays 31. In another suitable arrangement, the steps of FIG. 8 may be performed for two or more pixel sub-arrays 31 in parallel. In this way, each sub-array 31 may be read out at a different output frame rate based on the local temporal change within that sub-array 31. The amount of image data that is output to processing circuitry 18 may thereby be reduced and temporal artifacts such as image flicker may be attenuated.

If desired, stacked storage and processing circuitry 50 may compare image data from each sub-array 31 to image data in neighboring sub-arrays 31 of pixel array 17 to generate a frame of difference values between image data in a particular sub-array 31 to image data in a neighboring sub-array 31. In another suitable arrangement, stacked processing circuitry 50 may compare image data captured by a given sub-array 31 to image data captured in previous image frames by that sub-array 31. Processing circuitry 50 may generate a frame of difference values between the image data captured in a given image frame by sub-array 31 to image data captured in the previous image frame.

In yet another suitable arrangement, stacked processing circuitry 50 may use image data from some image pixels 30 within a given pixel sub-array 31 to predict image data (e.g., pixel values) for other image pixels within that pixel sub-array 31. In this scenario, processing circuitry 50 may generate a frame of difference values between the image data captured in a given sub-array 31 to predicted image data for that sub-array 31. Frames of image data may be replaced with frames of difference values to be output to processing circuitry 18. In this way, certain frames of image data and/or captured image data from some image pixels 30 may be omitted from read out from stacked image sensor 16 and readout efficiency may be improved.

In yet another suitable arrangement, stacked processing circuitry 50 may use a prediction scheme to generate predicted image data for some image pixels 30 in sub-arrays 31 using image data captured by adjacent image pixels 30 in the associated sub-arrays. The predicted image data may be encoded to further increase the amount of data compression performed by circuitry 50. For example, green pixel values in a particular sub-array 31 may be fit using a parametric smooth surface (e.g., a plane). The parametric surface may serve as a prediction model for image data in the associated sub-array 31 (e.g., storage and processing circuitry 50 may predict image data for the associated sub-array 31 using the prediction model). For example, the difference between a pixel value captured by a given image pixel 30 and the point on the parametric surface prediction model associated with that image pixel 30 may define an error for that image pixel. The prediction model may subsequently be output from stacked processing circuitry 50 and used by external processing circuitry to reconstruct image data for the associated sub-array 31 (e.g., the prediction model may be used by storage and processing circuitry 50 and/or processing circuitry 18 to predict image data from image pixels 30 that were not fit with the parametric surface). This example is merely illustrative. If desired, any color pixel values in sub-array 31 may be fit using a prediction model parametric surface.

Figure 9:
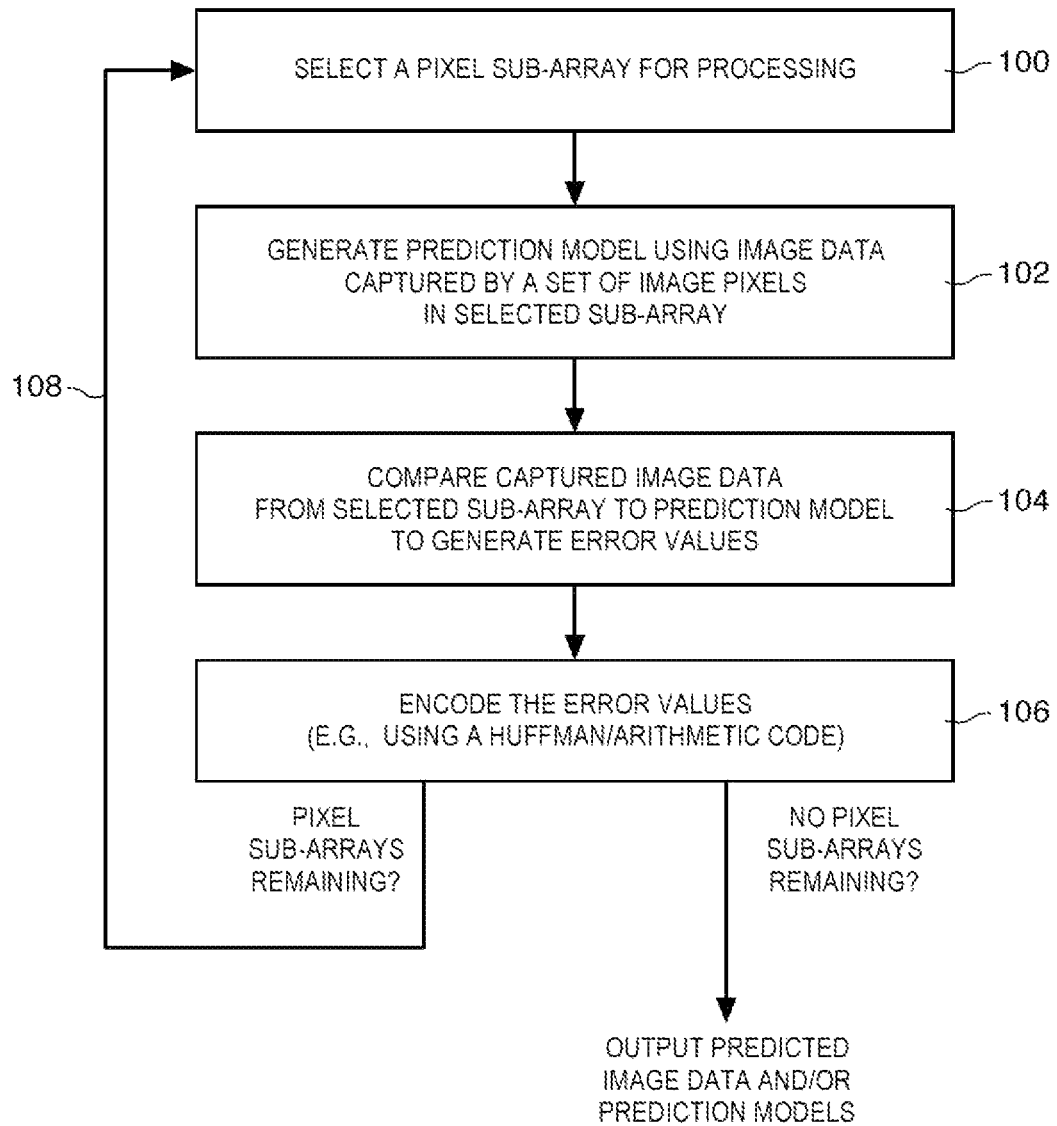
FIG. 9 is a flow chart of illustrative steps involved in generating and encoding an error value for pixel sub-arrays in stacked-chip image sensors in accordance with an embodiment of the present invention.

FIG. 9 is a flow chart of illustrative steps that may be performed by stacked processing circuitry 50 to encode error values for predicted image data to increase compression of data output by stacked image sensor 16. The steps of FIG. 9 may, for example, be performed by processing circuitry 50 while performing step 74 of FIG. 5.

At step 100, stacked processing circuitry 50 may select a pixel sub-array 31 for processing. For example, processing circuitry 50 may select first pixel sub-array 31-1 of FIG. 6 for processing.

At step 102, stacked processing circuitry 50 may generate a prediction model using image data captured by a first set of image pixels 30 in the selected sub-array. The first set of image pixels may, for example, include all image pixels 30 in the selected sub-array or may include a subset of image pixels 30 in the selected sub-array. The prediction model may, for example, be a parametric surface fit to the image data from the first set of image pixels 30. The prediction model may be used to predict image data for a second set of image pixels 30 in the selected sub-array.

At step 104, stacked processing circuitry 50 may compare the captured image data from the selected sub-array (e.g., from the second set of image pixels 30, from the first set of image pixels 30, or from any desired subset of image pixels 30 in the selected sub-array) to the prediction model to generate error values for the selected sub-array. For example, the error values may include difference values between the captured image data and the image data predicted by the generated parametric surface.

At step 106, stacked processing circuitry 50 may encode the error values. For example, stacked processing circuitry 50 may encode the error values for the selected sub-array 31 using a Huffman/arithmetic code.

If sub-arrays 31 remain for processing in image pixel array 17, processing may loop back to step 100 via path 108 to encode error values for additional sub-arrays 31 in pixel array 17. If no sub-arrays 31 remain for processing, processing circuitry 50 may, if desired, output the generated prediction models and/or the predicted image data to external processing circuitry such as processing circuitry 18 of FIG. 1.

Figure 10:
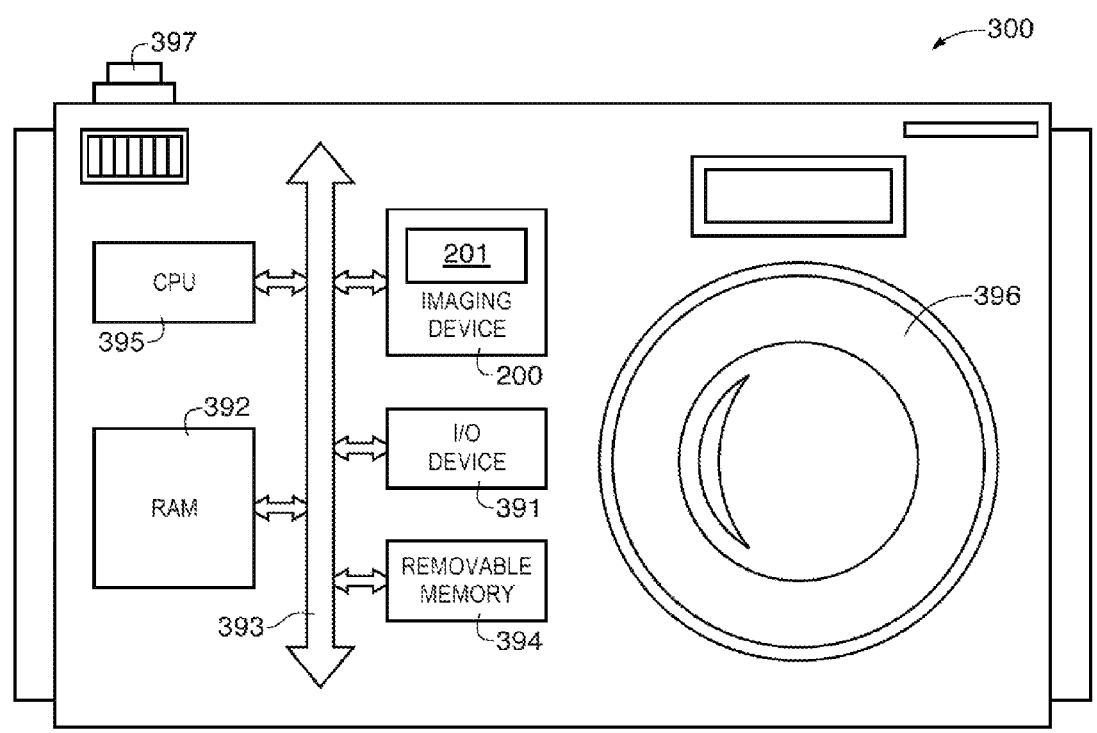
FIG. 10 is a block diagram of a processor system employing the image sensor of FIGS. 1-9 in accordance with an embodiment of the present invention.

FIG. 10 shows in simplified form a typical processor system 300, such as a digital camera, which includes an imaging device such as imaging device 200 (e.g., an imaging device 200 such as camera module 12 of FIG. 1 employing stacked storage and processing circuitry 50 and which is configured to compress image data for multiple pixel sub-arrays 31 before data read out to processing circuitry 18 as described in connection with FIGS. 1-9). Processor system 300 is exemplary of a system having digital circuits that could include imaging device 200. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating systems and methods for operating a stacked-chip image sensor having a planar array of image pixels and storage and processing circuitry. The stacked-chip image sensor may include a two-dimensional array of conductive metal vias coupled between the planar array of image pixels and the storage and processing circuitry. If desired, the stacked-chip image sensor may be coupled to off-chip image processing circuitry.

The planar array of image pixels may be partitioned into a number of image pixel sub-arrays. Each image pixel sub-array may be used to capture image data from a scene at a capture frame rate. The stacked-chip image sensor may, for example, capture a first set of image data using a first image pixel sub-array and may capture a second set of image data using a second image pixel sub-array. The first set of image data may be transferred to the storage and processing circuitry over a first set of conductive vias and the second set of image data may be transferred to a second set of conductive vias in the array of conductive vias for processing. The storage and processing circuitry may compress the first set of image data and the second set of image data and may output the compressed first and second sets of image data from the stacked-chip image sensor (e.g., to the off-chip image processing circuitry).

The storage and processing circuitry may identify respective spatial and/or temporal frequencies of image data in each image pixel sub-array. The storage and processing circuitry may determine respective compression block sizes for image data in each image pixel sub-array based on the associated spatial frequencies. The storage and processing circuitry may subsequently compress the image data in each image pixel sub-array using the associated compression block sizes.

If desired, the storage and processing circuitry may generate predicted image data for the a given image pixel sub-array and may compute a difference frame of image data for that image pixel sub-array by comparing the predicted image data to image data captured using that pixel sub-array. The storage and processing circuitry may, for example, generate the predicted image data by identifying temporal correlations between subsequently captured frames of image data. The difference frame may subsequently be output from the stacked-chip image sensor. If desired, the storage and processing circuitry may fit image data from a first set of image pixels in a given pixel sub-array with a parametric surface and may predict image data for a second set of image pixels in that pixel sub-array using the parametric surface. The storage and processing circuitry may subsequently output the parametric surface from the stacked-chip image sensor.

The compressed image data may be output from the stacked-chip image sensor at an output frame rate. The output frame rate may be less than the capture frame rate (e.g., a capture frame rate of greater than or equal to ninety frames per second and an output frame rate of less than or equal to sixty frames per second may be used). If desired, the storage and processing circuitry determine a respective temporal change in image data from each image pixel sub-array and may adjust the output frame rate for each image pixel sub-array based on the associated temporal change.

The stacked-chip image sensor and associated stacked-chip storage and processing circuitry for compressing captured image data prior to outputting the compressed data from the stacked-chip image sensor may be implemented in a system that also includes a central processing unit, memory, input-output circuitry, and an imaging device that further includes a lens for focusing light onto the array of image pixels in the stacked-chip image sensor, and a data converting circuit.

The foregoing is merely illustrative of the principles of this invention and various modifications can be made by those skilled in the art without departing from the scope and spirit of the invention. The foregoing embodiments may be implemented individually or in any combination.

What is claimed is:

1. A method for operating a stacked-chip image sensor having a planar array of image pixels, storage and processing circuitry that is vertically displaced from the planar array of image pixels in a direction that is perpendicular to the planar array of image pixels, control circuitry comprising analog-to-digital converter circuitry interposed between the planar array of image pixels and the storage and processing circuitry, and a plurality of conductive vias coupled between the planar array of image pixels and the storage and processing circuitry, wherein the planar array of image pixels includes a plurality of image pixel sub-arrays, the method comprising:

with a first image pixel sub-array in the plurality of image pixel sub-arrays, capturing a first set of image data, wherein the first image pixel sub-array comprises a first plurality of image pixels coupled to a first shared conductive path;

with a second image pixel sub-array in the plurality of image pixel sub-arrays, capturing a second set of image data;

with the first image pixel subarray, transferring the first set of image data to the control circuitry through a first set of conductive vias in the plurality of conductive vias;

with the analog-to-digital converter circuitry, converting the first set of image data to a first set of digital image data and transferring the first set of digital image data from the control circuitry to the storage and processing circuitry through the first set of conductive vias;

with the storage and processing circuitry, compressing the first set of digital image data to generate a first set of compressed image data;

with the second image pixel subarray, transferring the second set of image data to the control circuitry through a second set of conductive vias in the plurality of conductive vias;

with the analog-to-digital converter circuitry, converting the second set of image data to a second set of digital image data and transferring the second set of digital image data from the control circuitry to the storage and processing circuitry through the second set of conductive vias;

with the storage and processing circuitry, compressing the second set of digital image data to generate a second set of compressed image data; and with the storage and processing circuitry, outputting the first and second sets of compressed image data from the stacked-chip image sensor.

2. The method defined in claim 1, wherein compressing the first set of image data comprises:

identifying a spatial frequency distribution of the first set of image data;

determining a compression block size based on the identified spatial frequency distribution of the first set of image data; and compressing the first set of image data using the determined compression block size.

3. The method defined in claim 2, wherein compressing the second set of image data comprises:

identifying a spatial frequency distribution of the second set of image data;

determining an additional compression block size based on the identified spatial frequency distribution of the second set of image data; and compressing the second set of image data using the determined additional compression block size.

4. The method defined in claim 1, wherein compressing the second set of image data comprises compressing the second set of image data while compressing the first set of image data.

5. The method defined in claim 1, wherein the first image pixel sub-array includes a first set of image pixels and a second set of image pixels adjacent to the first set of image pixels, the method further comprising:

with the storage and processing circuitry, fitting image data from the first set of image pixels with a parametric surface; and with the storage and processing circuitry, predicting image data for the second set of image pixels using the parametric surface.

6. The method defined in claim 5, further comprising:

with the storage and processing circuitry, outputting the parametric surface from the stacked-chip image sensor.

7. The method defined in claim 1, wherein the second set of image data comprises a first frame of captured image data and a second frame of captured image data, the method further comprising:

identifying temporal correlations between the first frame of captured image data and the second frame of captured image data; and generating predicted image data for the second image pixel sub-array based on the identified temporal correlations.

8. The method defined in claim 1, wherein outputting the compressed first set of image data from the stacked-chip image sensor comprises:

determining a temporal change in the first set of image data;

determining an adjusted output frame rate based on the determined temporal change in the first set of image data; and outputting the compressed first set of image data from the stacked-chip image sensor at the adjusted output frame rate.

9. The method defined in claim 8, wherein outputting the compressed second set of image data from the stacked-chip image sensor comprises:

determining a temporal change in the second set of image data;

determining an additional adjusted output frame rate based on the determined temporal change in the second set of image data; and outputting the compressed second set of image data from the stacked-chip image sensor at the additional adjusted output frame rate.

10. The method defined in claim 1, wherein outputting the compressed first set of image data comprises outputting the compressed first set of image data at a first output frame rate and wherein outputting the compressed second set of image data comprises outputting the compressed second set of image data at a second output frame rate that is different from the first output frame rate.

11. A method for operating a stacked-chip image sensor that is coupled to off-chip image processing circuitry, wherein the stacked-chip image sensor comprises a planar array of image sensor pixels, an array of conductive vias, processing circuitry, and control circuitry comprising analog-to-digital converter circuitry interposed between the planar array of image sensor pixels and the processing circuitry, the method comprising:
 with the image sensor pixels, capturing image data;
 with the image sensor pixels, transferring the image data to the control circuitry through the array of conductive vias;
 with the analog-to-digital converter circuitry, converting the image data to digital image data;
 with the analog-to-digital converter circuitry, transferring the digital image data from the control circuitry to the processing circuitry through the array of conductive vias;
 with the processing circuitry, compressing the digital image data to generate compressed image data; and
 with the processing circuitry, outputting the compressed image data to the off-chip image processing circuitry.

12. The method defined in claim 11, wherein compressing the digital image data comprises:
 performing spatial compression on the digital image data.

13. The method defined in claim 12, wherein compressing the digital image data further comprises:
 performing temporal compression on the digital image data.

14. The method defined in claim 12, wherein performing the spatial compression on the digital image data comprises:
 determining a spatial frequency distribution of the digital image data;
 identifying a compression block size based on the spatial frequency distribution; and
 performing the spatial compression on the digital image data using the identified compression block size.

15. The method defined in claim 11, wherein capturing the image data comprises capturing the image data at a capture frame rate and wherein outputting the compressed image data comprises outputting the compressed image data at an output frame rate that is less than the capture frame rate.

16. The method defined in claim 11, wherein outputting the compressed image data comprises outputting the compressed image data at an output frame rate and wherein compressing the captured image data comprises:
 identifying a temporal change in the captured image data; and
 adjusting the output frame rate based on the identified temporal change in the captured image data.

17. A system, comprising:
 a central processing unit;
 memory;
 input-output circuitry; and
 an imaging device, wherein the imaging device comprises:
  a stacked-chip image sensor having a pixel array, storage and processing circuitry, control circuitry that includes analog-to-digital converter circuitry interposed between the pixel array and the storage and processing circuitry, a first set of vias that couples the pixel array to the control circuitry, and a second set of vias that couples the control circuitry to the storage and processing circuitry;
  image processing circuitry coupled to the stacked-chip image sensor; and
  a lens that focuses an image onto the pixel array, wherein the pixel array is partitioned into at least first and second pixel sub-arrays, wherein the first pixel sub-array is configured to capture a first set of image data at a capture frame rate, wherein the second pixel sub-array is configured to capture a second set of image data at the capture frame rate, wherein the first set of conductive vias is configured to transfer the first and second sets of image data from the pixel array to the control circuitry, wherein the control circuitry is configured to convert the first and second sets of image data into first and second sets of digital image data, wherein the second set of conductive vias is configured to transfer the first and second sets of digital image data from the control circuitry to the storage and processing circuitry, wherein the storage and processing circuitry is configured to compress the first and second sets of digital image data to generate first and second compressed sets of image data, and wherein the storage and processing circuitry is configured to output the first and second compressed sets of image data to the image processing circuitry at an output frame rate that is less than the capture frame rate.

18. The system defined in claim 17, wherein the output frame rate is less than or equal to sixty frames per second and wherein the capture frame rate is greater than or equal to ninety frames per second.

* * * * *